(12) United States Patent
Mann

(10) Patent No.: US 7,112,466 B2
(45) Date of Patent: Sep. 26, 2006

(54) SEMICONDUCTOR DEVICE FOR ISOLATING A PHOTODIODE TO REDUCE JUNCTION LEAKAGE AND METHOD OF FORMATION

(75) Inventor: Richard A. Mann, Torrance, CA (US)

(73) Assignee: ESS Technology, Inc., Freemont, CA (US)

(*) Notice: Subject to any disclaimer, the term of this patent is extended or adjusted under 35 U.S.C. 154(b) by 17 days.

(21) Appl. No.: 10/293,510

(22) Filed: Nov. 13, 2002

(65) Prior Publication Data

US 2004/0021194 A1 Feb. 5, 2004

Related U.S. Application Data

(62) Division of application No. 09/935,231, filed on Aug. 22, 2001, now abandoned.

(51) Int. Cl.
*H01L 21/00* (2006.01)
(52) U.S. Cl. .......................... 438/75; 438/60
(58) Field of Classification Search ........... 438/24, 438/57, 59, 60, 75, 44, FOR. 213; 257/233, 257/272
See application file for complete search history.

(56) References Cited

U.S. PATENT DOCUMENTS

| | | | | |
|---|---|---|---|---|
| 5,283,460 A | * | 2/1994 | Mita | 257/432 |
| 5,495,116 A | * | 2/1996 | Funakoshi et al. | 257/239 |
| 5,614,740 A | * | 3/1997 | Gardner et al. | 257/222 |
| 5,861,655 A | * | 1/1999 | Kozuka et al. | 257/446 |
| 6,150,676 A | * | 11/2000 | Sasaki | 257/191 |
| 6,534,335 B1 | * | 3/2003 | Rhodes et al. | 438/60 |
| 6,563,187 B1 | * | 5/2003 | Park | 257/446 |
| 2001/0015435 A1 | | 8/2001 | Suzuki et al. | |
| 2001/0019850 A1 | | 9/2001 | Connolly et al. | |

FOREIGN PATENT DOCUMENTS

EP       1028470 A2  *  8/2000

* cited by examiner

*Primary Examiner*—N. Drew Richards
(74) *Attorney, Agent, or Firm*—Farjami & Farjami LLP

(57) ABSTRACT

An improved semiconductor device that reduces reverse bias junction leakage in a photodiode by using a junction isolation region to isolate the photodiode from a trench isolation region. The improved semiconductor device improves image quality for different applications such as stand-alone digital cameras and digital cameras embedded in other imaging devices such as cellular phones and personal digital assistants.

15 Claims, 6 Drawing Sheets

SEMICONDUCTOR DEVICE FOR ISOLATING A PHOTODIODE TO REDUCE JUNCTION LEAKAGE AND METHOD OF FORMATION

CROSS REFERENCE TO RELATED APPLICATIONS

This is a divisional of co-pending U.S. application Ser. No. 09/935,231, filed on Aug. 22, 2001 abandoned, which is incorporated herein by reference to the extent permitted by law.

BACKGROUND OF THE INVENTION

1. Technical Field

This invention generally relates to semiconductor devices and, more particularly, to semiconductor devices that isolate a photodiode in a solid-state image sensor to lower junction leakage to thereby improve image quality.

2. Background

Complementary metal oxide semiconductor (CMOS) technology has made significant strides in competing with charge coupled device (CCD) technology as the solid-state image sensor of choice for use in various applications such as stand-alone digital cameras and digital cameras embedded in other imaging devices (e.g., cellular phones and personal digital assistants). The principle advantages of CMOS sensor technology are lower power consumption, higher levels of system integration and the ability to support very high data rates.

To remain competitive, CMOS technology must improve in various areas, including the area of image quality. One source of image quality problems is known as "dark current" from junction leakage in a reverse-biased photodiode used in CMOS image sensors. Junction leakage remains a problem in sub-micron CMOS process technology since this technology has generally not been optimized for low junction leakage, but rather has been optimized for digital logic speed. This optimization for high switching speed results in shallow source/drain junctions that have higher junction leakage. Thus, imager devices have been typically constructed in a process technology that was originally optimized for digital logic, not low junction leakage. In the image sensor area, the leakage of charge from a reverse-biased photodiode is conventionally known as "dark current" since the charge leakage produces a signal in the absence of light. When this dark current is too high, the variance in the dark current degrades image quality and can also limit the maximum integration time for light collection. There is therefore a need to reduce the dark current in the CMOS fabrication process for forming image sensors.

One source of dark current is from the shallow trench isolation process methods for typical CMOS logic and analog process flows that have not yet been optimized for extremely low reverse bias junction leakage. As is well known in the art, shallow trench isolation is used for various metal oxide semiconductor circuits to address common problems associated with standard LOCOS isolation (e.g., bird's beak problems where oxide grows under the edge of the blocking silicon nitride layer to increase the size of the semiconductor device). In standard shallow trench isolation, a shallow trench is etched between elements in a semiconductor and filled with a deposited dielectric. After sidewall oxidation and dielectric fill of oxide, a CMP step typically occurs.

The source of the dark current in shallow trench isolation methods for typical CMOS process flows usually stems from damage to the silicon surface that occurs during etching of the shallow trench. This damage increases the density of traps and other imperfections in the silicon substrate and causes increased junction leakage, which, in turn, degrades image quality in CMOS image sensors. CMOS imagers perform best if the junction leakage is very low and preferably less than $2.0 \times 10^{-17}$ amps per pixel. Standard methods can result in reverse bias junction leakage which are one or two orders of magnitude higher than the goal for CMOS imagers.

A need therefore exists to reduce reverse-bias junction leakage to levels suitable for high performance imaging applications using the CMOS sensor. This solution also should be easily integrated in a common CMOS process flow with little additional manufacturing costs.

SUMMARY

A number of technical advances are achieved in the art by implementation of an improved semiconductor device that isolates a photodiode from a shallow trench isolation region to reduce junction leakage that typically occurs when the photodiode and shallow trench isolation region are in contact. The improved semiconductor device may be broadly conceptualized as a device that alleviates dark current problems normally associated with solid-state image sensors by incorporating the improved semiconductor device. Different applications such as stand-alone digital cameras and digital cameras embedded in other imaging devices (such as cellular phones and personal digital assistants) obtain better image quality through the improved semiconductor device.

In one example implementation, an improved semiconductor device may be configured having a substrate where the substrate has a plurality of devices formed therein. A photodiode is formed in the substrate and receives photoelectrons in response to photons received by the semiconductor device. The photodiode has an exterior surface that is in contact with a junction isolation region. The junction isolation region is also formed in the substrate between the photodiode and a trench isolation region. The junction isolation region prevents contact between the photodiode and the trench isolation region to lower the junction leakage due to contact between these two elements in the past. The trench isolation region is also formed in the substrate and provides electrical isolation for the photodiode from the plurality of devices in the substrate. The trench isolation region has a trench isolation exterior surface that is in contact with the isolation region. In this example configuration, the isolation region is used to isolate the photodiode from the trench isolation region to lower junction leakage and improve image quality in CMOS image sensors.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

In this example implementation of the invention, the leakage current in an improved semiconductor device of a CMOS imager is controlled through modification of the CMOS manufacturing flow to yield increased performance of the photodiode in the CMOS imager pixel. This increased performance is yielded at low cost and without disruption or interference with the standard CMOS elements in the process flow. The best doping levels and exact details are dependent upon the details of the CMOS flow. It should be obvious that the basic principles illustrated in these example implementations of the invention can be modified to adapt to a wide range of specific process conditions using standard methods of simulation to estimate the most appropriate implementation.

Figure 1:
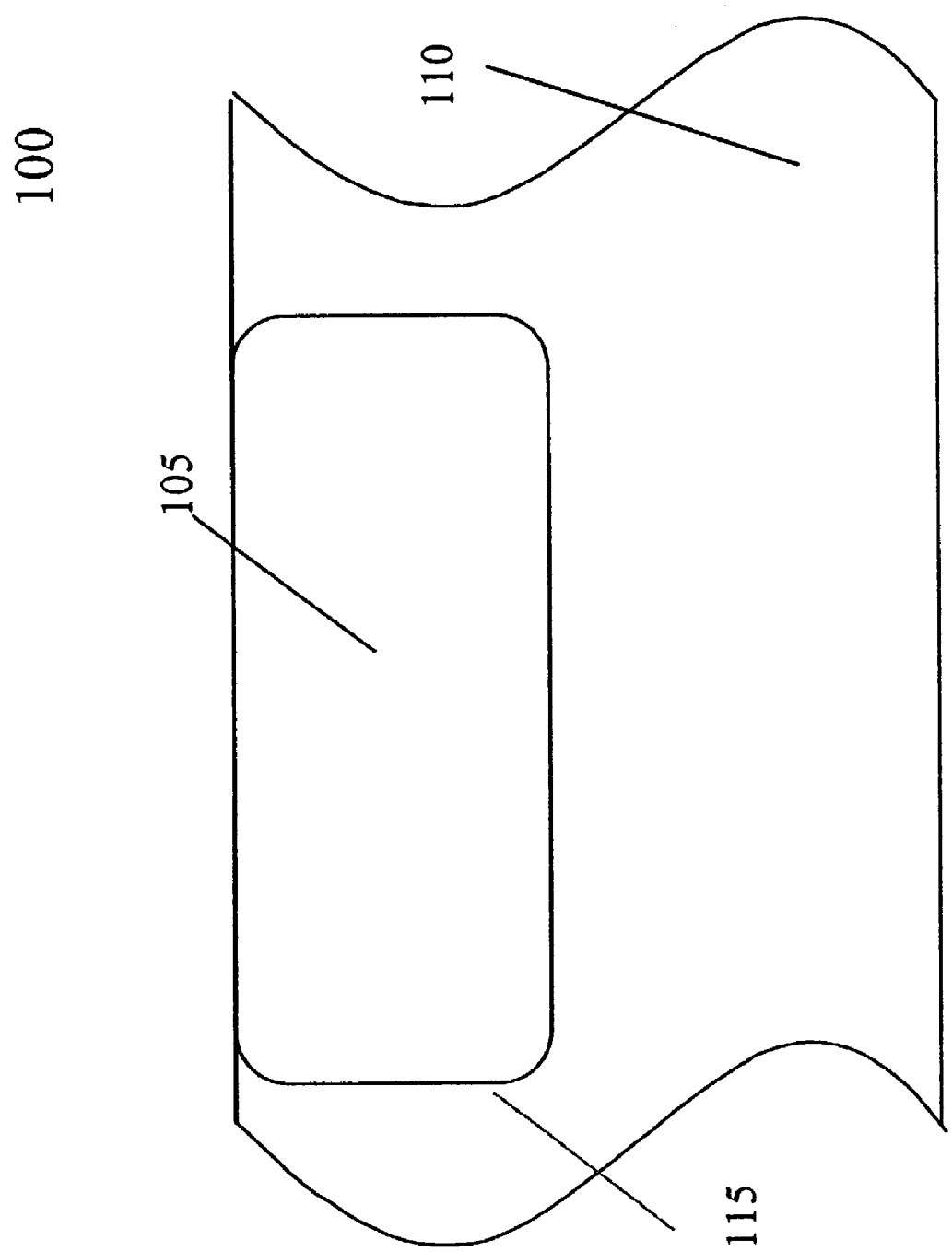
FIG. 1 is a cross-sectional view of an example implementation of a step in forming an improved semiconductor device in accordance with the invention.

FIG. 1 is a cross-sectional view of an example implementation of a step in forming an improved semiconductor device in accordance with the invention. In FIG. 1, the formation of the example implementation of the improved semiconductor device 100 begins on a substrate 110. In one example implementation, the substrate 110 is a silicon substrate (e.g., a P-type silicon substrate). It is understood that other example implementations may use other substrate materials such as epitaxial wafers, N-type silicon wafers and/or silicon-on-insulator wafers. In the substrate 110 is formed a photodiode 105. In one example implementation, the photodiode 105 is a region doped by an N-type dopant (e.g. phosphorous). By using an N-type dopant in the photodiode, the photodiode 105 has a positive potential and attracts photoelectrons that will be captured by the potential of a reverse-biased photodiode. It is understood that the N-type dopant is implanted in the substrate 110 using standard fabrication techniques, well known in the art. The photodiode 105 receives and captures photoelectrons in response to photons that are received by the semiconductor device 100. Thus, photons (quantum of radiant energy), such as light, from an image to be sensed are received by the semiconductor device 100. The photons falling on the semiconductor device 100 are received by the photodiode 105 (or a plurality of photodiodes in another example implementation). When received, the photons cause the formation of electron-hole pairs in the semiconductor device 100. The electrons are attracted to and collected in the photodiode 105 resulting in a flow of current proportional to the intensity of the photon radiation. This collected current results in a change in the potential on the photodiode which can be sensed and read out for formation of an image. In one example implementation, the N-type dopant (e.g. phosphorous) is implanted in the substrate 110 with a carrier concentration implant dose in the range of about $1 \times 10^{15}$ to $1 \times 10^{16}$ ions/cm$^2$. At these doping levels, the depletion region of the N/P diode formed by the photodiode 105 and a junction isolation region (to be formed in further formation steps) permits the isolation region to extend into the more lightly doped photodiode 105 and prevents the photodiode 105 from contacting the trench isolation region (to be formed) that causes the dark current problems. At this doping level of the example implementation, the photodiode 105 maintains a low capacitance and has low junction leakage.

Figure 2:
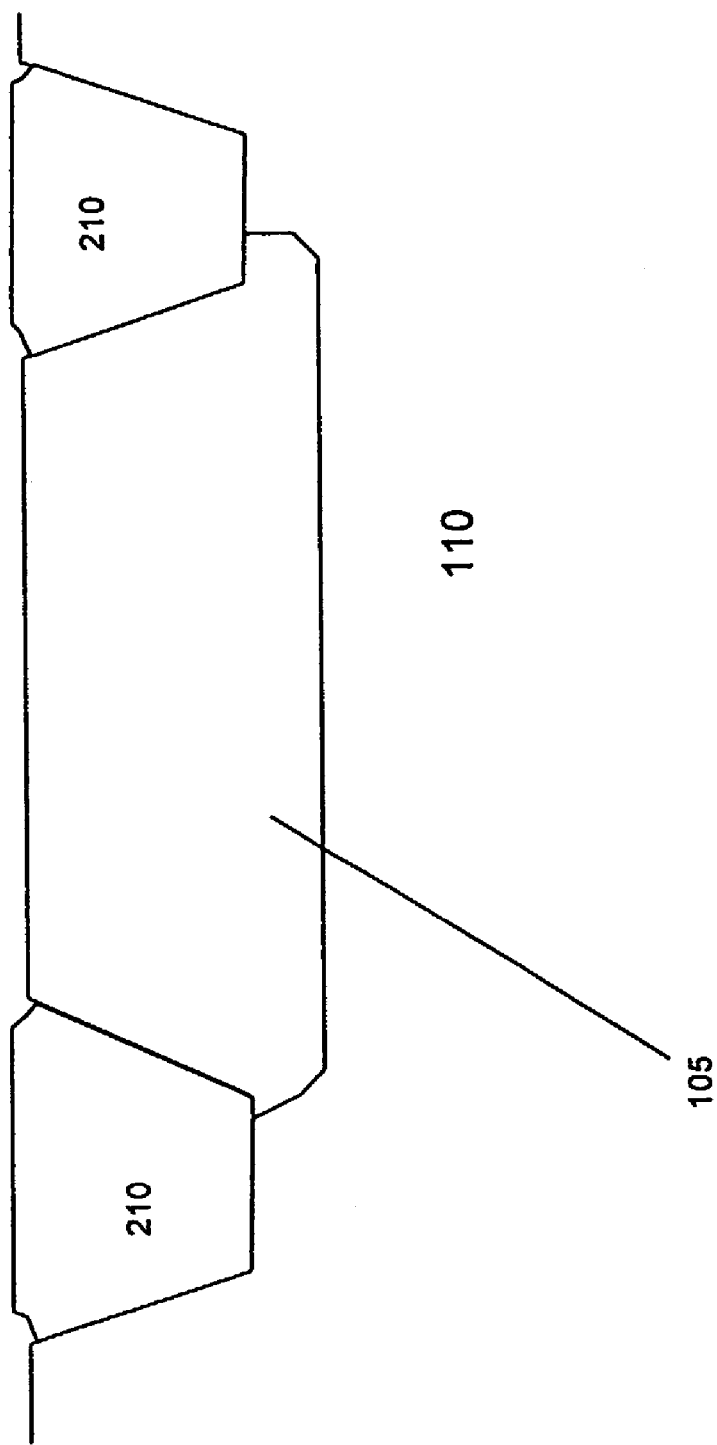
FIG. 2 is a cross-sectional view of an example implementation of a further step in forming an improved semiconductor device in accordance with the invention.

FIG. 2 is a cross-sectional view of an example implementation of a further step in forming an improved semiconductor device in accordance with the invention. In FIG. 2, the substrate 110 receives further processing to form trench isolation regions 210 using standard patterning procedures and methods well known in the industry. In one example implementation, the trench isolation regions 210 are formed by forming a shallow recess in the silicon substrate 110 (using, e.g., dry etching techniques well known in the art), filling the shallow recess with an insulating material (e.g. silicon dioxide) and then planarizing to form the trench isolation region 210. The trench isolation region 210 is used to electrically isolate the photodiode 105 from other devices (not shown) on the semiconductor device as is known in the art.

Figure 3:
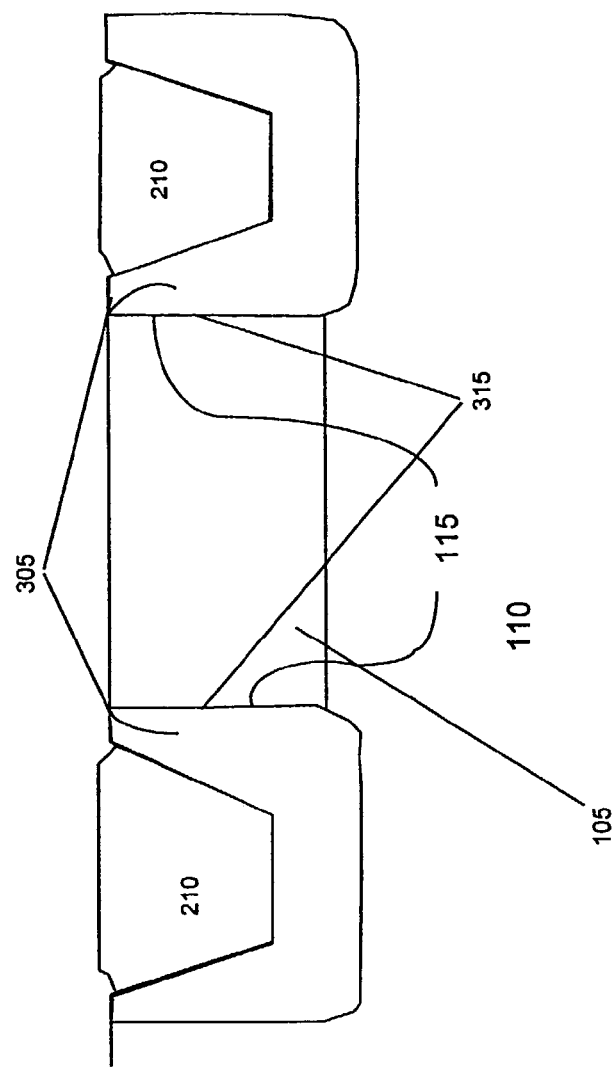
FIG. 3 is a cross-sectional view of an example implementation of a further step in forming an improved semiconductor device in accordance with the invention.

FIG. 3 is a cross-sectional view of an example implementation of a further step in forming an improved semiconductor device in accordance with the invention. In FIG. 3, the semiconductor device 200 of FIG. 2 has a junction isolation region 305 implanted in the substrate 110. The semiconductor device 300, in this example implementation step, has implanted a P-type dopant (e.g. boron) to form the junction isolation region 305. The junction isolation region 305 is formed using typical patterning and implantation techniques, well known in the art. The junction isolation region 305 can be most conventionally formed using the masking methods and implants used in forming the P-well for a typical sub-micron NMOS device. In this way, the total cost of manufacture is kept low by using masks and implants already present in a typical CMOS flow to accomplish formation of the junction isolation region 305. While the junction isolation region 305 is formed after the trench isolation region 210 in this example implementation, it is understood that the junction isolation region 305 may be formed after the formation of the trench isolation region 210 in other example implementations. In one example implementation, the photodiode 105 is masked to form a masked photodiode region. Then the substrate 110, around the masked photodiode region, is etched to form an isolation region space in the substrate 110. A P-type dopant (e.g. boron) is then deposited into the isolation region space to form the junction isolation region. In one example implementation, the P-type dopant is deposited by implanting the dopant with a carrier concentration implant dose in the range of about $1 \times 10^{17}$ to $5 \times 10^{17}$ ions/cm$^2$. The junction isolation region 305 has a junction isolation region exterior surface 315 that is between the photodiode exterior surface 115 and the trench isolation region 210. The junction isolation region 305 prevents the depletion region of the photodiode 105 from making contact with the surface of the trench isolation region 210. The higher doping level of region 305 ensures that the depletion region of the junction isolation region 305 to the photodiode 105 extends mostly into the photodiode 105. This solution is an implementation into the CMOS fabrication process that adds little cost to the manufacturing process, yet provides the benefit of lowering junction leakage. Typically, when the photodiode contacts the surface of the trench isolation region (to be formed), the junction leakage may be about 10 to 100 nano amps/cm$^2$ of junction layout. With the junction isolation region 305, the typical leakage is reduced to less than 1 nano amp/cm$^2$ of junction layout. In one example implementation, the junction isolation region 305 has a thickness in the range of about 0.15 to 0.30 microns.

Figure 4:
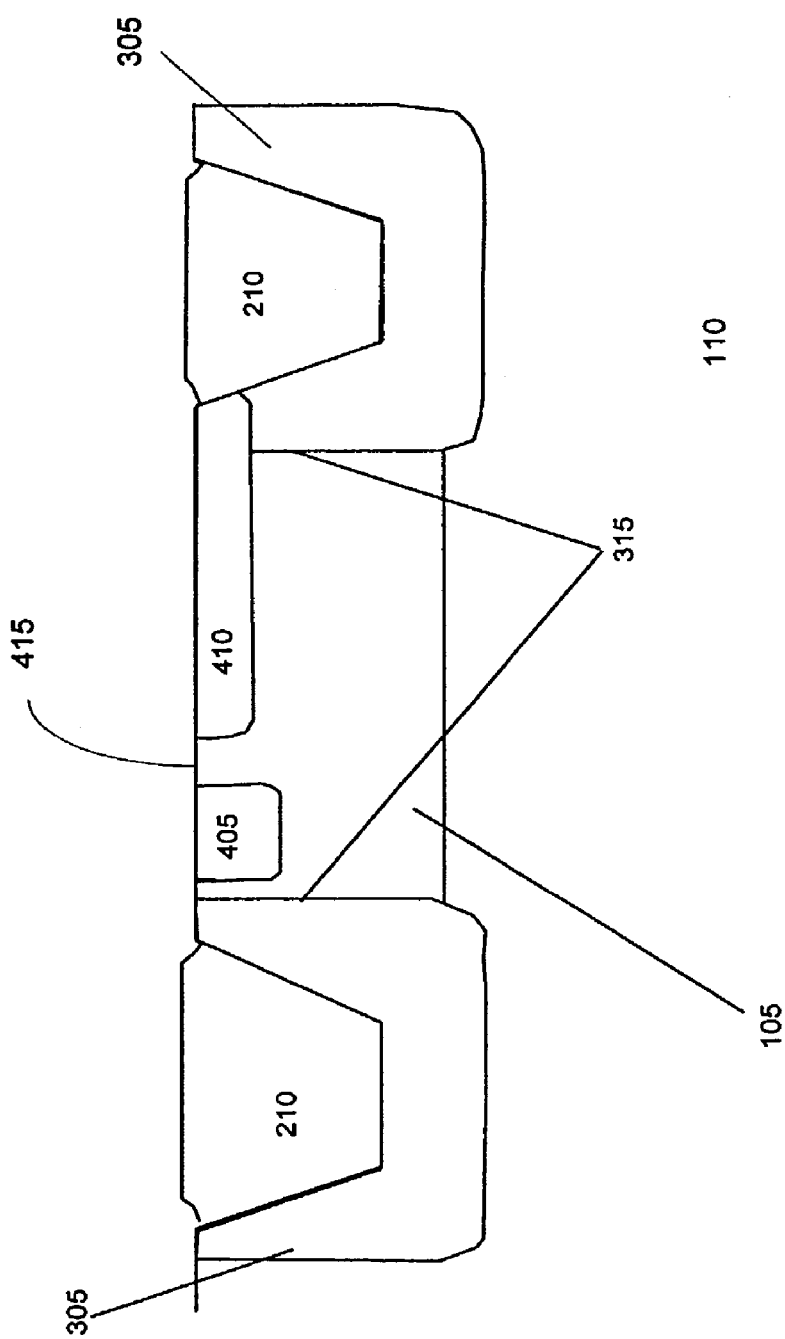
FIG. 4 is a cross-sectional view of an example implementation of a further step in forming an improved semiconductor device in accordance with the invention.

FIG. 4 is a cross-sectional view of an example implementation of a further step in forming an improved semiconductor device in accordance with the invention. In FIG. 4, two additional implants have been added to the semiconductor device 300 of FIG. 3, a conduction surface implant 405 and an isolation surface implant 410. These two implants have been added, in this example implementation, to optimize the doping profile of the photodiode 105 while assuring minimum contact between the photodiode 105 and the silicon surface (where additional contacts and metallization layers will reside). The conduction surface implant 405 is, in one example implementation, formed by implanting an N-type dopant (e.g. phosphorous) to overlie the photodiode 105. By being in contact with the substrate surface 415 and the photodiode 105, the conduction surface implant 405 is able to provide electrical contact between the photodiode 105 and the surface 415 of the substrate 110. Thus, as additional layers (e.g. metallization layers) are formed on the substrate 110, the photodiode 105 may make electrical contact with those layers when necessary. To reduce manufacturing costs, the dopant in region 405 can be provided by the same masks and implants as used to form a typical N-type lightly doped drain area or a typical N-type source/drain implant.

The isolation surface implant 410 is used to provide electrical isolation to the photodiode 105 to prevent the depletion region of the photodiode 105 from contacting the silicon surface. Thus, when no electrical contact is needed above the photodiode 105, the isolation surface implant is used. In one example implementation, the isolation surface implant is formed by implanting a P-type dopant (e.g. boron) to overly the photodiode 105 where needed. It is understood that while FIG. 4 depicts both the conduction 405 and isolation 410 surface implants, other example implementations may use only one of these implants. To minimize manufacturing costs, the implant in region 410 can be provided by the same manufacturing steps used to form the P-type lightly doped drain extensions or a P-type source/drain implant in a typical sub-micron CMOS process.

These implants may be formed, in one example implementation, as follows. The conduction surface implant 405 is formed by using standard photolithography and implant methods. To form the conduction surface implant 405, an N-type dopant (e.g. phosphorous) is implanted in the semiconductor device substrate 110 with a carrier concentration implant dose in the range of about $1.5 \times 10^{12}$ to $3 \times 10^{13}$ ions/cm$^2$; and at an energy level of about 40 kilo-electron volts. Similarly, the isolation surface implant 410 is formed using standard photolithography and implant methods. The isolation surface implant 410 is deposited in the semiconductor device substrate 110 with an P-type dopant (e.g. boron) with a carrier concentration implant dose in the range of about $5 \times 10^{12}$ to $1 \times 10^{13}$ ions/cm$^2$ and at an energy level of about 40 kilo-electron volts. While FIGS. 1–4 provide an example implementation of a single improved semiconductor device, it is understood that a plurality of these improved semiconductor devices may be used to form the solid state image sensor package of FIG. 6 below.

Figure 5:
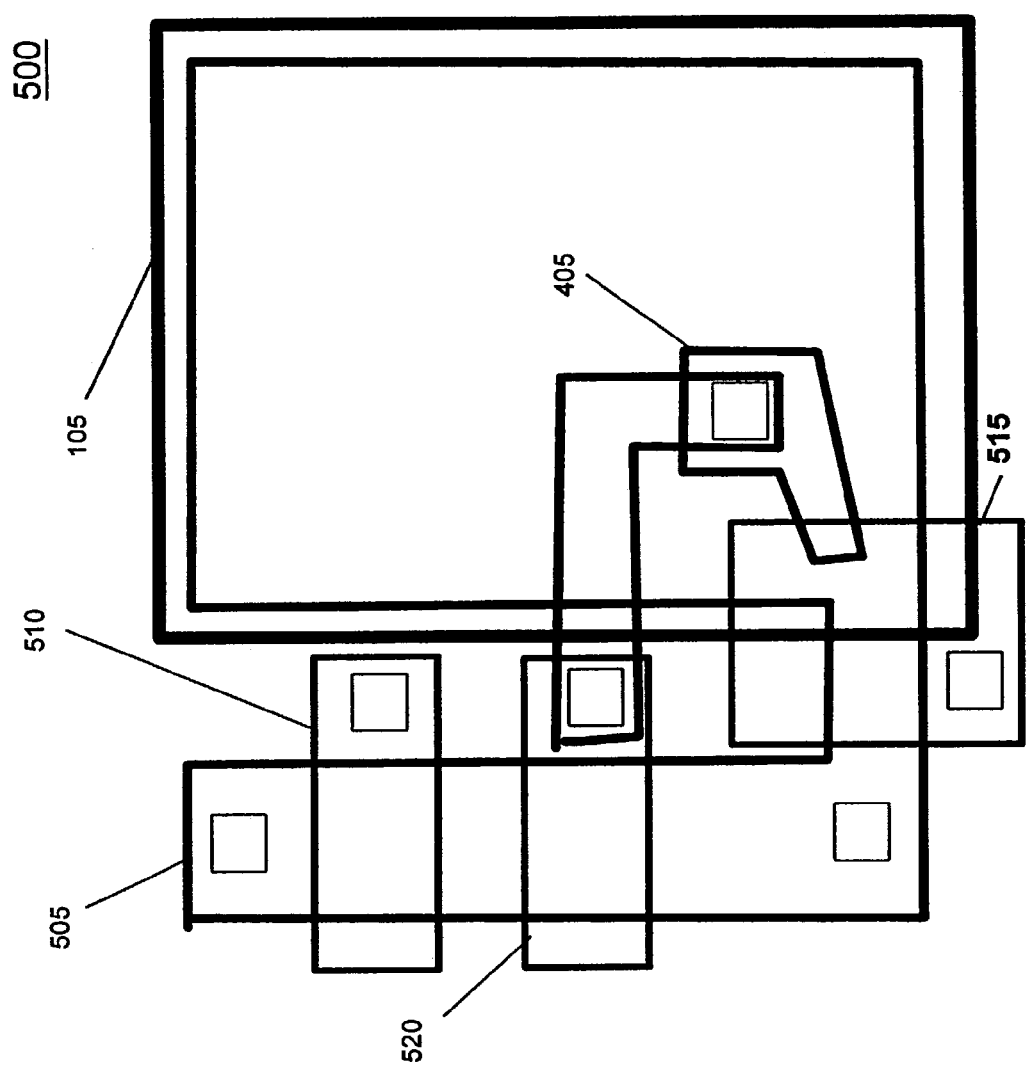
FIG. 5 is a layout view of an example implementation of the improved semiconductor device in accordance with the invention.

FIG. 5 is a layout view of an example implementation of the improved semiconductor device in accordance with the invention. In FIG. 5, the improved semiconductor device of FIGS. 1–4 is shown as part of a pixel 500 used in a CMOS image sensor. The outlining 505 is the active edge of the pixel 500. The area enclosed in the outlining 505 is used for transistor and photodiode formation and the area outside of outlining 505 is the trench isolation region 210 (FIGS. 1–4). Each pixel contains three transistors: a select transistor 510, a source follower transistor 520 and a reset transistor 515. The source follower transistor 520 is illustrated as connected to the photodiode 105. The contact to the photodiode is made at implant area 405. Light is collected by the photodiode 105 causing a change in the potential on the photodiode which is read out through the action of the select 510 and source follower 520 transistors. The reset transistor 515 is used to establish a constant potential on the photodiodes prior to the start of exposure to light. It is understood that the transistors 510, 520, 515 are, in one example implementation, NMOS transistors.

Figure 6:
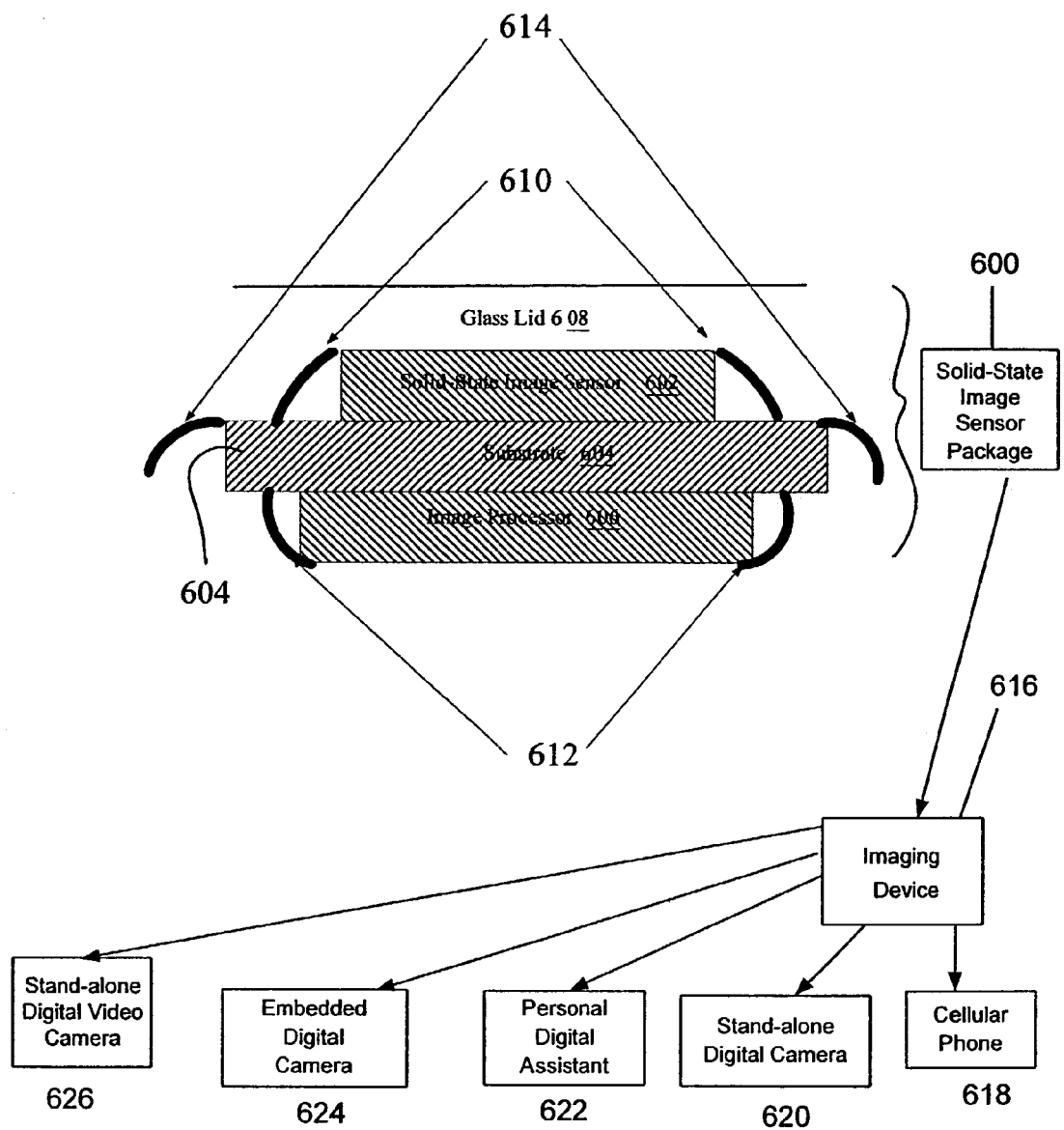
FIG. 6 is a side view of an example implementation of a solid-state image sensor package incorporating a plurality of the improved semiconductor device in accordance with the invention.

FIG. 6 is a side view of an example implementation of a solid-state image sensor package incorporating the improved semiconductor device in accordance with the invention. In FIG. 6, a solid state image sensor 602, in this example implementation, contains a plurality of the improved semiconductor devices of FIGS. 1–4. Each of the plurality of photodiodes has the structure of the semiconductor device of FIG. 4, in this example implementation. That is, each of the plurality of photodiodes receive photoelectrons in response to the photons received by the semiconductor device and each of the devices has a trench isolation region separated from the photodiode by a junction isolation region. In another example implementation, the plurality of photodiodes form a solid-state image sensor 602 (such as a charge coupled device, a charge injection device or a complementary metal oxide semiconductor image sensor) that is packaged as shown in FIG. 6. The solid-state image sensor package 600 includes a solid-state image sensor 602, a substrate 604, an image processor 606, a glass lid 608, sensor electrical leads 610, processor electrical leads 612 and package electrical leads "pins") 614. The solid-state image sensor 602 and the image processor 606 are mounted on the substrate 604. The image sensor 602 and the image processor 606 are attached to the substrate 604 by standard epoxies. The substrate 604 may be formed of any type of substrate material known in the art, including, for example, a semiconductor substrate, a ceramic substrate or an organic laminate substrate. As an example implementation, the substrate 604 is a ceramic leadless chip carrier of about 2 millimeters in thickness. In another example implementation, the substrate 604 may also be a plastic leadless chip carrier or a ball grid array substrate, all known in the art.

Surrounding the substrate 604 are numerous pins 614 that electrically connect the solid-state image sensor package 600 to various other imaging devices 616 such as a stand-alone digital camera (both still 620 and video 626 cameras), and embedded digital cameras 624 (that may be used in cellular phones 618, personal digital assistants (PDA) 622 and the like). In another example implementation, various imaging devices 616 may be coupled to image sensor package 600, including digital still cameras, tethered PC cameras, imaging enabled mobile devices (e.g. cell phones, pagers, PDA's and laptop computers), surveillance cameras, toys, machine vision systems, medical devices and image sensors for automotive applications.

The solid-state image sensor 602 is electrically connected to the image processor 606 by sensor electrical leads 610 and processor electrical leads 612 through the substrate 604. The sensor electrical leads 610 and processor electrical leads 612 are conducting wires for transmitting signals between the solid-state image sensor 602 and the image processor 606. The sensor electrical leads 610 are also utilized to electrically connect the solid-state image sensor 602 to power sources (not shown), ground (not shown), the pins 614 and other electrical devices (not shown) located either on or off the substrate 604. As an example implementation, the solid-state image sensor 602 has 52 sensor electrical leads. A glass lid 608 protects the solid-state image sensor package from environmental hazards such as dust, temperature, etc.

While various embodiments of the invention have been described, it will be apparent to those of ordinary skill in the art that many more embodiments and implementations are possible that are within the scope of this invention.

What is claimed is:

1. A method for forming a semiconductor device, comprising:
    providing a substrate;
    forming a photodiode in the substrate, the photodiode receiving photoelectrons in response to photons received by the semiconductor device,
    forming a trench isolation region in the substrate;
    forming a junction isolation region in the substrate, the junction isolation region having an exterior surface that is between an exterior surface of the photodiode and the trench isolation region, wherein a doping level of the junction isolation region is higher than a doping level of the photodiode such that a depletion region of the photodiode is prevented from contacting a surface of the trench isolation region, thus lowering a junction leakage; and
    forming an isolation surface implant, the isolation surface implant being situated within the photodiode and only in a portion of the photodiode, such that the isolation surface implant is in contact with a top surface of the substrate to provide electrical isolation between the photodiode and the top surface of the substrate, wherein the isolation surface implant is not covered by an insulating film.

2. The method of claim 1, wherein the substrate is a P-type silicon substrate.

3. The method of claim 1, wherein the step of forming a photodiode further comprises:
    implanting in the substrate an N-type dopant.

4. The method of claim 3, wherein the N-type dopant is phosphorous.

5. The method of claim 3, further comprising:
    implanting the N-type dopant with a carrier concentration implant dose in the range of about $1 \times 10^{15}$ to $1 \times 10^{16}$ ions/cm$^2$.

6. The method of claim 1, wherein the step of forming the junction isolation region further comprises:
    depositing a P-type dopant, the P-type dopant being boron.

7. The method of claim 6, wherein the P-type dopant is deposited by:
    implanting the P-type dopant with a carrier concentration implant dose in the range of about $1 \times 10^{17}$ to $5 \times 10^{17}$ ions/cm$^2$.

8. The method of claim 6, wherein the P-type dopant has a thickness in the range of about 0.15 to 0.30 microns.

9. A method for forming a semiconductor device, comprising:
    providing a substrate;
    forming a photodiode in the substrate, the photodiode receiving photoelectrons in response to photons received by the semiconductor device;
    forming a trench isolation region in the substrate;
    forming a junction isolation region in the substrate, the junction isolation region formed between the photodiode and the trench isolation region so that the photodiode does not contact the trench isolation region;
    forming an isolation surface implant, the isolation surface implant overlying the photodiode, the isolation surface implant being in contact with a top surface of the substrate to provide electrical isolation between the photodiode and the top surface of the substrate; and
    forming a conduction surface implant, the conduction surface implant overlying the photodiode, the conduction surface implant being in contact with the top surface of the substrate to provide electrical contact between the photodiode and the top surface of the substrate.

10. The method of claim 9, wherein the step of forming the conduction surface implant further comprises:
    depositing an N-type dopant.

11. The method of claim 10, wherein the step of depositing the N-type dopant further comprises depositing phosphorous.

12. The method of claim 10, wherein the N-type dopant is deposited by:
    implanting the N-type dopant with a carrier concentration implant dose in the range of about $1.5 \times 10^{12}$ to $3 \times 10^{13}$ ions/cm$^2$; and
    implanting the N-type dopant at an energy level of about 40 kilo-electron volts.

13. A method for forming a semiconductor device, comprising:
    providing a substrate;
    forming a photodiode in the substrate, the photodiode receiving photoelectrons in response to photons received by the semiconductor device;
    forming a trench isolation region in the substrate;
    forming a junction isolation region in the substrate, the junction isolation region having an exterior surface that is between an exterior surface of the photodiode and the trench isolation region, wherein a doping level of the junction isolation region is higher than a doping level of the photodiode such that a depletion region of the photodiode is prevented from contacting a surface of the trench isolation region, thus lowering a junction leakage;
    forming an isolation surface implant, the isolation surface implant being situated within the photodiode and only in a portion of the photodiode, such that the isolation surface implant is in contact with a top surface of the substrate to provide electrical isolation between the photodiode and the top surface of the substrate, wherein the isolation surface implant is not covered by an insulating film; and
    wherein the step of forming the isolation surface implant further comprises a step of depositing a P-type dopant.

14. The method of claim 13, wherein the step of depositing the P-type dopant further comprises depositing boron.

15. The method of claim 13, wherein the P-type dopant is deposited by:
    implanting the P-type dopant with a carrier concentration implant dose in the range of about $5 \times 10^{12}$ to $1 \times 10^{13}$ ions/cm$^2$; and
    implanting the P-type dopant at an energy level of about 40 kilo-electron volts.

* * * * *